(12) United States Patent
Liu

(10) Patent No.: US 12,324,231 B2
(45) Date of Patent: Jun. 3, 2025

(54) SEMICONDUCTOR STRUCTURE AND METHOD OF FORMING THE SAME

(71) Applicant: Semiconductor Manufacturing South China Corporation, Shanghai (CN)

(72) Inventor: Zhong Yuan Liu, Shanghai (CN)

(73) Assignee: Semiconductor Manufacturing South China Corporation, Shanghai (CN)

( * ) Notice: Subject to any disclaimer, the term of this patent is extended or adjusted under 35 U.S.C. 154(b) by 441 days.

(21) Appl. No.: 17/721,961

(22) Filed: Apr. 15, 2022

(65) Prior Publication Data
US 2022/0352155 A1    Nov. 3, 2022

(30) Foreign Application Priority Data
Apr. 28, 2021   (CN) .......................... 202110471168.0

(51) Int. Cl.
| | | |
|---|---|---|
| *H10D 84/83* | (2025.01) | |
| *H10D 30/01* | (2025.01) | |
| *H10D 30/62* | (2025.01) | |
| *H10D 84/01* | (2025.01) | |
| *H10D 84/03* | (2025.01) | |

(52) U.S. Cl.
CPC ......... *H10D 84/834* (2025.01); *H10D 30/024* (2025.01); *H10D 30/6211* (2025.01); *H10D 84/0151* (2025.01); *H10D 84/0158* (2025.01); *H10D 84/038* (2025.01)

(58) Field of Classification Search
CPC .......................... H01L 27/0886; H10D 84/834
See application file for complete search history.

(56) References Cited

U.S. PATENT DOCUMENTS

| | | | |
|---|---|---|---|
| 2019/0103318 A1* | 4/2019 | Wang | .................. H01L 21/3086 |
| 2020/0212195 A1* | 7/2020 | Wang | .................. H01L 21/0262 |

* cited by examiner

*Primary Examiner* — Douglas M Menz
(74) *Attorney, Agent, or Firm* — Anova Law Group, PLLC

(57) ABSTRACT

A method of forming a semiconductor structure includes: providing a substrate having a first region and a plurality of second regions, the first region being located between adjacent second regions; forming a plurality of discrete first fins on the first region; forming a plurality of discrete second fins on a second region of the plurality of second regions; forming an isolation layer on the substrate to cover portions of sidewalls of the plurality of discrete first fins and the plurality of discrete second fins, a top surface of the isolation layer being lower than top surfaces of the plurality of discrete first fins and the plurality of discrete second fins; after the isolation layer is formed, removing the plurality of discrete second fins to form a plurality of isolation openings in the isolation layer; and forming a filling layer in the plurality of isolation openings.

16 Claims, 6 Drawing Sheets

SEMICONDUCTOR STRUCTURE AND METHOD OF FORMING THE SAME

CROSS-REFERENCE TO RELATED APPLICATION

This application claims priority to Chinese Patent Application No. 202110471168.0, filed on Apr. 28, 2021, the entire content of which is incorporated herein by reference.

TECHNICAL FIELD

The present disclosure relates to the technical field of semiconductor fabrication technologies and, more particularly, to a semiconductor structure and a method of forming the semiconductor structure.

BACKGROUND

As integrated circuits advance toward higher densities, devices forming circuits are placed more closely on a chip to fit available space on the chip. Correspondingly, the density of active devices per unit area of a semiconductor substrate continuously increases, and effective insulating isolation between devices becomes more important. Shallow trench isolation (STI) technology provides good isolation effects, such as process isolation effect and electrical isolation effect. STI technology also reduces a wafer surface area occupied by each device and increases integration density of the devices. Therefore, as sizes of integrated circuits reduce, STI layers are used for isolations between active regions of the devices. However, conventional isolation layers still have many problems.

Thus, there is a need to provide a semiconductor structure and formation method with improved performance.

SUMMARY

One aspect of the present disclosure provides a method of forming a semiconductor structure. The method includes: providing a substrate having a first region and a plurality of second regions, the first region being located between adjacent second regions; forming a plurality of discrete first fins on the first region; forming a plurality of discrete second fins on a second region of the plurality of second regions; after the plurality of discrete first fins and the plurality of discrete second fins are formed, forming an isolation layer on the substrate to cover portions of sidewalls of the plurality of discrete first fins and the plurality of discrete second fins, a top surface of the isolation layer being lower than top surfaces of the plurality of discrete first fins and the plurality of discrete second fins; after the isolation layer is formed, removing the plurality of discrete second fins to form a plurality of isolation openings in the isolation layer; and forming a filling layer in the plurality of isolation openings.

Optionally, before the filling layer is formed, the method of forming the semiconductor structure further includes: forming a stop layer on sidewalls and top surfaces of the plurality of isolation openings, on a top surface of the isolation layer, and on exposed sidewalls and top surfaces of the plurality of discrete first fins.

Optionally, forming the stop layer includes an atomic layer deposition process.

Optionally, forming the filling layer includes: forming a filling material layer in the plurality of isolation openings and on the isolation layer to cover the plurality of discrete first fins; and etching back the filling material layer until a top surface of the stop layer is exposed to form the filling layer.

Optionally, the filling layer and the stop layer are made of different materials.

Optionally, the filling layer is made of silicon oxide; and the stop layer is made of silicon nitride.

Optionally, forming the filling material layer includes a fluid chemical vapor deposition process.

Optionally, after the filling layer is formed, the method further includes removing the stop layer located on the isolation layer and on the sidewalls and the top surfaces of the plurality of discrete first fins.

Optionally, after the filling layer is formed, the method further includes forming a gate dielectric layer on the exposed sidewalls and top surfaces of the plurality of discrete first fins.

Optionally, an interval size between adjacent first fins is a first size, an interval size between adjacent second fins is a second size, and the first size is equal to the second size.

Optionally, forming the isolation layer includes: forming an initial isolation layer on the substrate to cover the sidewalls of the plurality of discrete first fins and the plurality of discrete second fins; and etching back the initial isolation layer to form the isolation layer to cover portions of the sidewalls of the plurality of discrete first fins and the plurality of discrete second fins, the top surface of the isolation layer being lower than the top surfaces of the plurality of discrete first fins and the plurality of discrete second fins.

Optionally, forming the initial isolation layer includes: forming an initial isolation material layer on the substrate to cover the plurality of discrete first fins and the plurality of discrete second fins; annealing the initial isolation material layer to form an isolation material layer; and planarizing the isolation material layer until the top surfaces of the plurality of discrete first fins and the plurality of discrete second fins are exposed to form the initial isolation layer.

Optionally, forming the initial isolation material layer includes a fluid chemical vapor deposition process.

Another aspect of the present disclosure provides a semiconductor structure. The semiconductor structure includes: a substrate having a first region and a plurality of second regions, the first region being located between adjacent second regions; a plurality of discrete first fins formed on the first region; an isolation layer formed on the substrate to cover portions of sidewalls of the plurality of discrete first fins, a top surface of the isolation layer being lower than top surfaces of the plurality of discrete first fins and the plurality of discrete second fins; a plurality of isolation openings formed in the isolation layer located in the plurality of discrete second regions; a stop layer formed on bottoms surfaces and sidewalls of the plurality of isolation openings; and a filling layer located in the plurality of isolation openings, wherein the filling layer is located on the stop layer, and a top surface of the filling layer and a top surface of the isolation layer are evenly leveled.

Optionally, the substrate and the plurality of discrete first fins are made of silicon, germanium, silicon germanium, silicon carbide, gallium arsenide, or indium gallium.

Optionally, the isolation layer is made of silicon oxide or silicon oxynitride.

Optionally, the filling layer and the stop layer are made of different materials.

Optionally, the filling layer is made of silicon oxide; and the stop layer is made of silicon nitride.

Optionally, the semiconductor structure further includes a gate dielectric layer formed on the isolation layer on the sidewalls and top surfaces of the plurality of discrete first fins.

Optionally, the gate dielectric layer is made of a high-K dielectric material; and the high-K dielectric material includes lanthanum oxide, cerium oxide, or hafnium oxide.

The technical solution of the present disclosure has the following advantages: in the method for forming the technical solution of the present disclosure, after the plurality of the discrete first fins and the plurality of discrete second fins are formed, the isolation layer is formed to cover the portions of the sidewalls of the plurality of discrete first fins and the plurality of discrete second fins, and the top surface of the isolation layer is lower than the top surfaces of the plurality of discrete first fins and the plurality of discrete second fins. Through forming the plurality of discrete first fins and the plurality of discrete second fins first, because adjacent discrete fins are evenly spaced, the etching environment used by the etching process in the first region and the plurality of second regions remains consistent in the process of forming the isolation layer. As a result, the top surface of the formed isolation layer is ensured to be evenly leveled. That is, the top surface of the isolation layer located in the first region and the top surface of the isolation layer located in the plurality of second regions are uniformly leveled. Thus, the performance of the formed semiconductor structure is improved.

Further, before the filling layer is formed, the method further includes: forming a stop layer on sidewalls and top surfaces of the plurality of isolation openings, on top surfaces of the isolation layer, and on exposed sidewalls and top surfaces of the plurality of discrete first fins. The stop layer can stop etching on a surface of the stop layer in subsequent etching back of a filling material layer, such that the isolation layer is prevented from being over-etched and damaged, causing reduction in isolation effectiveness of the isolation layer.

BRIEF DESCRIPTION OF THE DRAWINGS

To more clearly illustrate the technical solution of the present disclosure, the accompanying drawings used in the description of the disclosed embodiments are briefly described below. The drawings described below are merely some embodiments of the present disclosure. Other drawings may be derived from such drawings by a person with ordinary skill in the art without creative efforts and may be encompassed in the present disclosure.

DETAILED DESCRIPTION OF THE EMBODIMENTS

Embodiments of the present disclosure are described in detail below with reference to the accompanying drawings. It will be appreciated that the described embodiments are some rather than all of the embodiments of the present disclosure. Other embodiments obtained by those having ordinary skills in the art on the basis of the described embodiments without inventive efforts should fall within the scope of the present disclosure.

Figure 1:
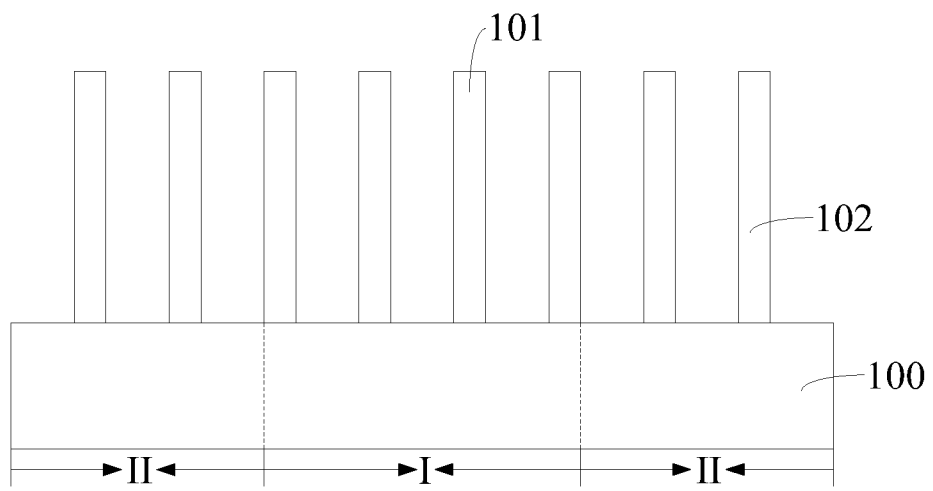
FIGS. 1-4 are schematic structural diagrams of a semiconductor structure.

FIGS. 1-4 are schematic structural diagrams of an exemplary semiconductor structure according to some embodiments of the present disclosure. The semiconductor structure is formed by an exemplary method of forming the semiconductor structure consistent with the embodiments of the present disclosure. As shown in FIG. 1, the semiconductor structure includes a substrate 100. The substrate 100 includes a first region I, and a plurality of second regions II. The first region I is located between adjacent second regions II. The first region I includes a plurality of discrete first fins 101. Each of the plurality of second regions II includes a plurality of discrete second fins 102.

Figure 2:
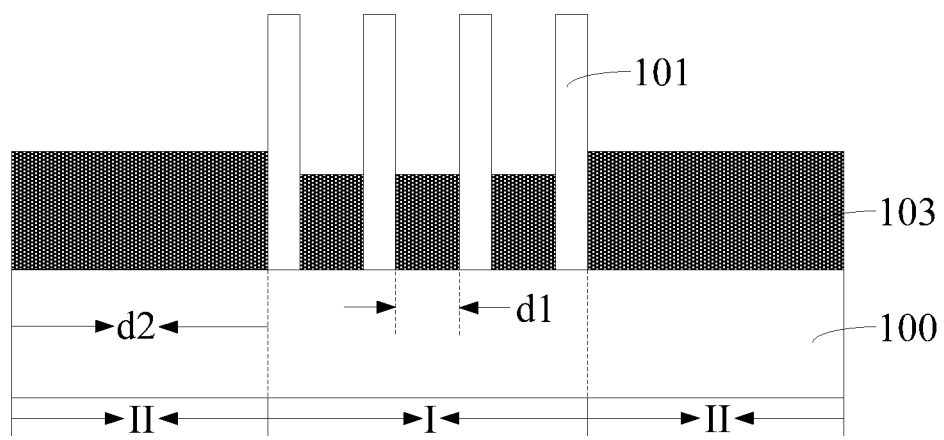

Referring to FIG. 2, the plurality of discrete second fins 102 is removed. An initial isolation layer (not shown) is formed on the substrate 100. The initial isolation layer covers portions of sidewalls of each of the plurality of discrete first fins 101. The initial isolation layer is etched to form an isolation layer 103. The isolation layer 103 covers the portions of the sidewalls of each of the plurality of discrete first fins 101. A top surface of the isolation layer is lower than a top surface of the plurality of discrete first fins 101.

In some embodiments, to ensure that structures and volumes of each of the plurality of discrete first fins 101 are consistent, at the same time the plurality of discrete first fins 101 is formed, the plurality of discrete second fins 102 is formed. Through the plurality of discrete second fins 102, an etching environment in which the plurality of discrete first fins 101 is etched remains consistent, such that the formed structures and the volumes of each of the plurality of discrete first fins 101 are consistent.

However, after the plurality of discrete second fins 102 is removed, an interval size d1 between adjacent sides of adjacent first fins 101 is smaller than a length size d2 of each of the plurality of second regions II. In a process of etching back the initial isolation layer, because the interval size d1 between adjacent sides of adjacent first fins 101 is small, an etching rate of the initial isolation layer located between adjacent first fins 101 is greater than an etching rate of the initial isolation layer located in the plurality of second regions II, such that a height of the top surface of the formed isolation layer 103 becomes inconsistent. That is, the top surface of the isolation layer 103 located in the plurality of second regions II is higher than the top surface of the isolation layer 103 located in the first region I.

Figure 3:
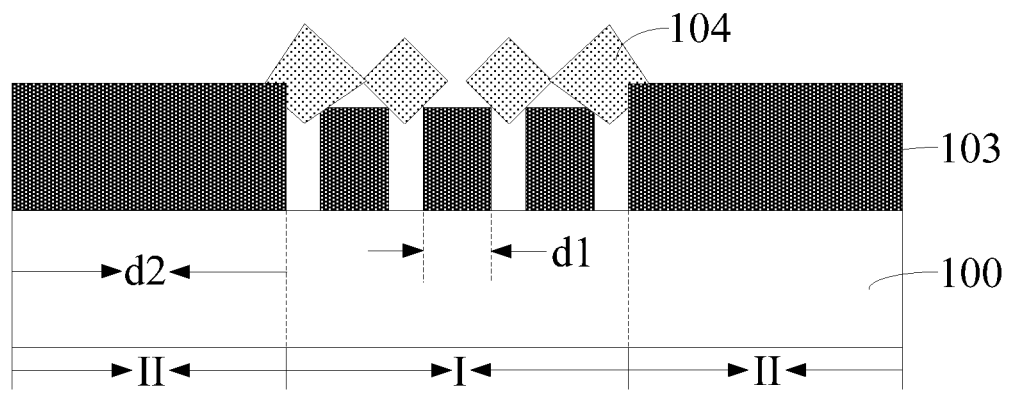
Figure 4:
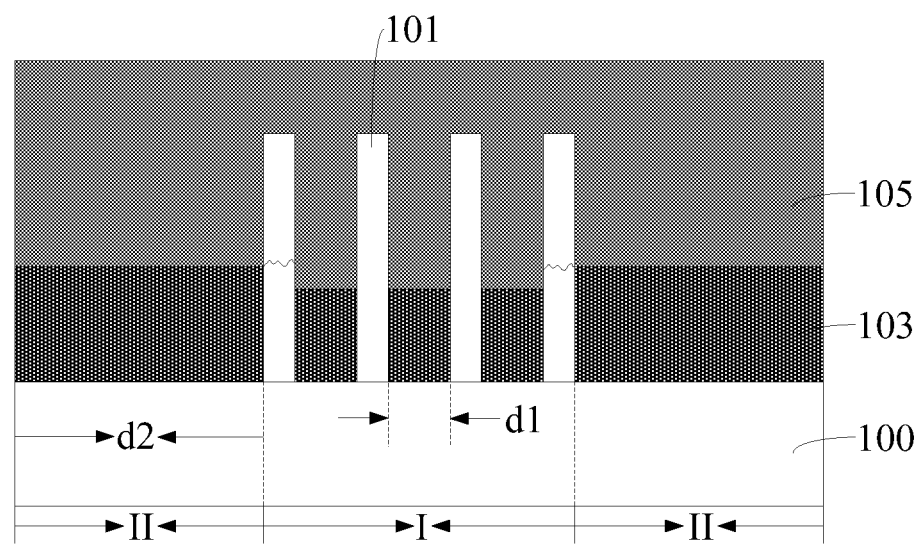

Referring to FIG. 3, after the isolation layer 103 is formed, the method of forming the semiconductor structure of the present disclosure further includes: forming a plurality of source-drain doped layers 104 in the plurality of discrete first fins 101.

Because the top surface of the isolation layer 103 in the plurality of second regions II is higher than the top surface of the isolation layer 103 in the first region I, when forming the plurality of source-drain doped layers 104, the plurality of source-drain doped layers 104 formed in a peripheral first fin 101 may grow excessively in a direction toward the first region I due to blocking by the isolation layer 103 in the plurality of second regions II, such that short circuits are likely to occur between adjacent source-drain doped layers 104.

Referring to FIG. 3, after the isolation layer 103 is formed, a dielectric layer 105 is formed on the isolation layer 103.

Because the top surface of the isolation layer 103 located in the plurality of second regions II is higher than the top surface of the isolation layer 103 located in the first region I, the dielectric layer 105 located in the first region I and the dielectric layer 105 located in the plurality of second regions II apply different stresses on the peripheral first fin 101. Because the stress generated by the dielectric layer 105 on the peripheral first fin 101 is differentiated, when a stress difference reaches a certain value, the peripheral first fin 101 is likely to be stretched and broken.

Based on the above description, the present disclosure provides a semiconductor structure and a method of forming the semiconductor structure. After the plurality of discrete first fins and the plurality of discrete second fins are formed, the method includes forming the isolation layer. Through forming the plurality of discrete first fins and the plurality of discrete second fins, because adjacent discrete fins are evenly spaced, the etching environment used by the etching process in the first region and the plurality of second regions remains consistent in the process of forming the isolation layer. Thus, the top surface of the formed isolation layer is ensured to be evenly leveled, and performance of the formed semiconductor structure is improved.

To make the above objectives, features, and advantages of the present disclosure more clearly understood, the embodiments of the present disclosure will be described in detail below with reference to the accompanying drawings.

The present disclosure provides a method of forming a semiconductor structure. FIG. 11 is a flowchart of an exemplary method of forming the semiconductor structure according to some embodiments of the present disclosure. FIGS. 5-10 are schematic structural diagrams of various steps of the exemplary method of forming the semiconductor structure according to some embodiments of the present disclosure. As shown in FIG. 11, at S1101, a substrate having a first region and a plurality of second regions is provided. The first region is located between adjacent second regions.

Figure 5:
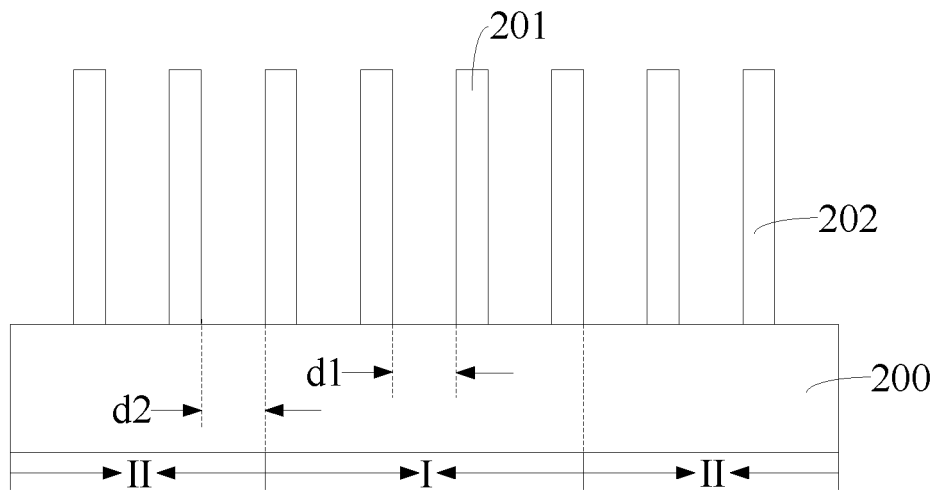
FIGS. 5-10 are schematic structural diagrams of various steps of an exemplary method of forming the semiconductor structure according to some embodiments of the present disclosure.

Referring to FIG. 5, the semiconductor structure includes a substrate 200. The substrate 200 includes a first region I and a plurality of second regions II. The first region I is located between adjacent second regions II.

Referring to FIG. 11, at S1102 and S1103, a plurality of discrete first fins is formed on the first region, and a plurality of discrete second fins is formed on a second region of the plurality of second regions.

As a result, the first region I includes a plurality of discrete first fins 201. Each of the plurality of second regions II includes a plurality of discrete second fins 202.

In some embodiments, the substrate 200, forming the plurality of discrete first fins 201, the plurality of discrete second fins 202 includes providing an initial substrate (not shown); forming a patterned layer (not shown) on the initial substrate, the patterned layer exposing a portion of a top surface of the initial substrate; and using the patterned layer as a mask to etch the initial substrate to form the substrate 200, the plurality of discrete first fins 201, and the plurality of discrete second fins 202.

In some embodiments, the substrate 200 is made of silicon. In some other embodiments, the substrate 200 may also be made of germanium, silicon germanium, silicon carbide, gallium arsenide, or indium gallium.

In some embodiments, the plurality of discrete first fins and the plurality of discrete second fins 202 are made of silicon. In some other embodiments, the plurality of discrete first fins 201 and the plurality of discrete second fins 202 may also be made of germanium, silicon germanium, silicon carbide, gallium arsenide, or indium gallium.

In some embodiments, the interval size between adjacent sides of adjacent first fins 201 is a first size d1, and the interval size between adjacent sides of adjacent second fins 202 is a second size d2. The first size d1 is equal to the second size d2.

Referring back to FIG. 11, at S1104, after the plurality of discrete first fins and the plurality of discrete second fins are formed, an isolation layer is formed on the substrate to cover portions of sidewalls of the plurality of discrete first fins and the plurality of discrete second fins. A top surface of the isolation layer is lower than top surfaces of the plurality of discrete first fins and the plurality of discrete second fins.

Figure 6:
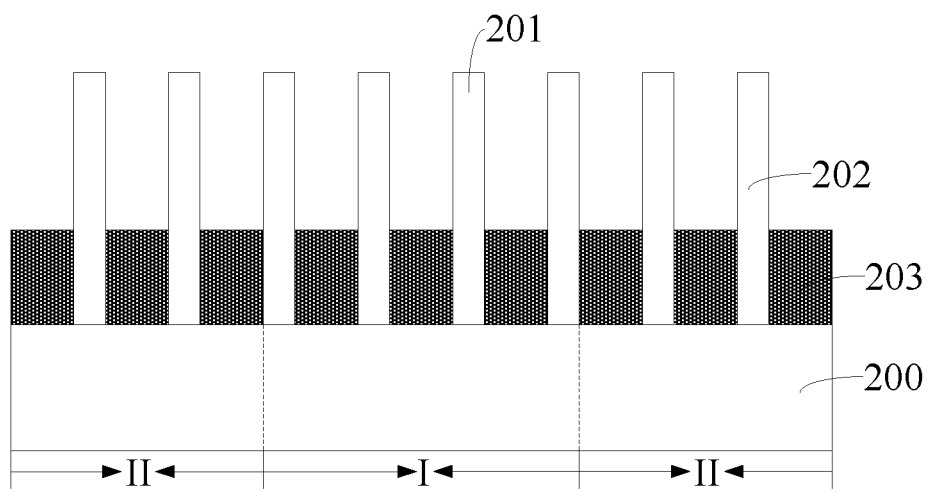

Referring to FIG. 6, after the plurality of discrete first fins 201 and the plurality of discrete second fins 202 are formed, an isolation layer 203 is formed on the substrate 200. The isolation layer 203 covers portions of sidewall surfaces of the plurality of discrete first fins 201 and the plurality of discrete second fins 202, and a top surface of the isolation layer 203 is lower than top surfaces of the plurality of discrete first fins 201 and the plurality of discrete second fins 202.

In some embodiments, through forming the plurality of discrete first fins 201 and the plurality of discrete second fins 202, because adjacent discrete fins are evenly spaced, the etching environment used by the etching process in the first region I and the plurality of second regions II remains consistent in the process of forming the isolation layer 203. As such, the top surface of the formed isolation layer 203 is ensured to be evenly leveled, that is, the top surface of the isolation layer 203 located in the first region I and the top surface of the isolation layer 203 located in the plurality of second regions II are uniformly leveled. Thus, the performance of the formed semiconductor structure is improved.

In some embodiments, the method of forming the isolation layer 203 includes: forming an initial isolation layer (not shown) on the substrate 200, the initial isolation layer covering sidewalls of the plurality of discrete first fins 201 and the plurality of discrete second fins 202; and etching back the initial isolation layer to form an isolation layer 203. The isolation layer 203 covers the portions of the sidewall surfaces of the plurality of discrete first fins 201 and the plurality of discrete second fins 202, and the top surface of the isolation layer 203 is lower than the top surfaces of the plurality of discrete first fins 201 and the plurality of discrete second fins 202.

In some embodiments, the method of forming the initial isolation layer includes: forming an initial isolation material layer (not shown) on the substrate 200, the initial isolation material layer covering the plurality of discrete first fins 201 and the plurality of discrete second fins 202; annealing the initial isolation material layer to form an isolation material layer; planarizing the isolation material layer until the top surfaces of the plurality of discrete first fins 201 and the plurality of discrete second fins 202 are exposed to form the initial isolation layer.

In some embodiments, the process of forming the initial isolation material layer includes a fluid chemical vapor deposition process.

In some embodiments, the isolation layer 203 is made of an insulating material, and the insulating material includes silicon oxide or silicon oxynitride. In some embodiments, the isolation layer 203 is made of silicon oxide.

Referring back to FIG. 11, at S1105, after the isolation layer is formed, the plurality of discrete second fins is removed to form a plurality of isolation openings in the isolation layer.

Figure 7:
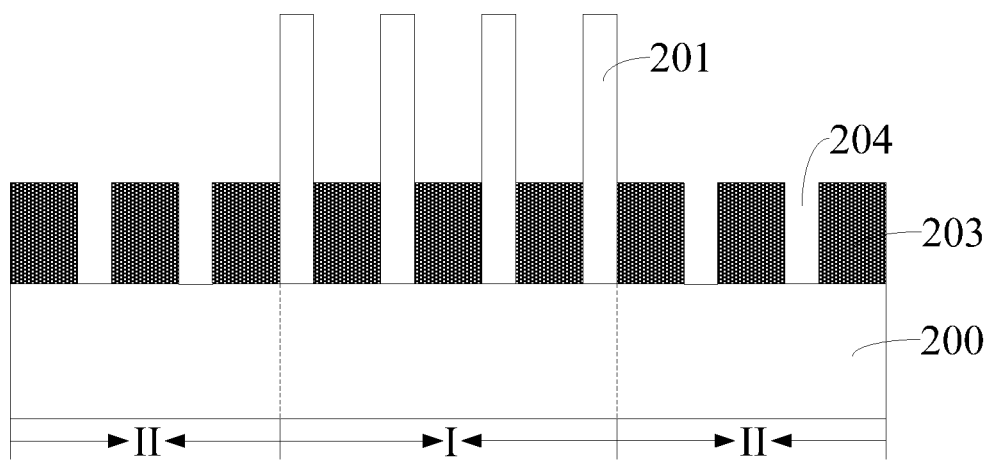

Referring to FIG. 7, after the isolation layer 203 is formed, the plurality of discrete second fins 202 is removed, and a plurality of isolation openings 204 is formed in the isolation layer 203.

In some embodiments, the process of removing the plurality of discrete second fins 202 is a wet etching process. In some other embodiments, the process of removing the plurality of discrete second fins 202 may also be a dry etching process.

Figure 8:
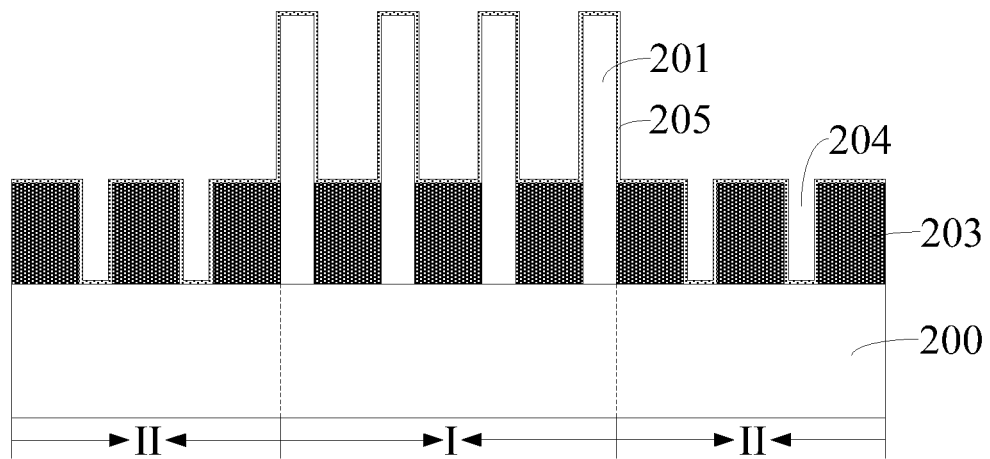

Referring to FIG. 8, after the plurality of isolation openings 204 is formed, a stop layer 205 is formed on sidewalls and top surfaces of the plurality of isolation openings 204, on top surfaces of the isolation layer 203, and on exposed sidewalls and top surfaces of the plurality of discrete first fins 201.

In some embodiments, the stop layer 205 can stop etching on a surface of the stop layer 205 in subsequent etching back of a filling material layer, such that the isolation layer 203 is prevented from being over-etched and damaged, causing reduction in isolation effectiveness of the isolation layer 203.

In some embodiments, the process of forming the stop layer 205 includes an atomic layer deposition process.

Referring back to FIG. 11, at S1106, a filling layer is formed in the plurality of isolation openings.

Figure 9:
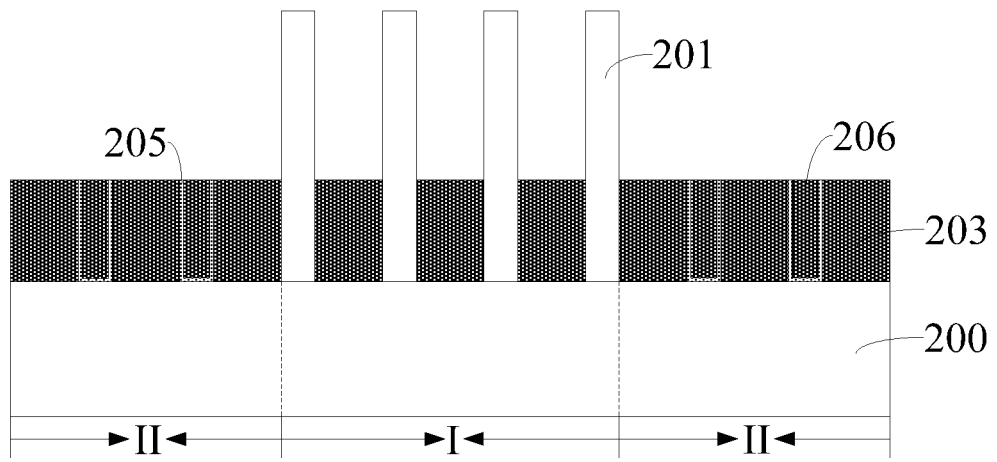

Referring to FIG. 9, a filling layer 206 is formed in the plurality of isolation openings 204.

In some embodiments, a method of forming the filling layer 206 includes: forming the filling material layer (not shown) in the plurality of isolation openings 204 and on the isolation layer 203, the filling material layer covering the plurality of discrete first fins 201; and etching back the filling material layer until the top surface of the stop layer 205 is expose to form the filling layer 206.

In some embodiments, the process of forming the filling material layer includes a fluid chemical vapor deposition process.

In some embodiments, the filling layer 206 and the stop layer are made of different materials. The filling layer 206 is made of silicon oxide, and the stop layer 205 is made of silicon nitride. Through selecting different materials for the filling layer 206 and the stop layer 205, an etching selectivity ratio between the filling layer 206 and the stop layer 205 can be improved when the filling material layer is etched back. Further, it can be ensured that the etching process stops on the surface of the stop layer 205, thereby reducing damage to the isolation layer 203.

In some embodiments, referring to FIG. 9 again, after the filling layer 206 is formed, the stop layer 205 located on the isolation layer 203 and on the sidewalls and the top surfaces of the plurality of discrete first fins 201 is removed.

Figure 10:
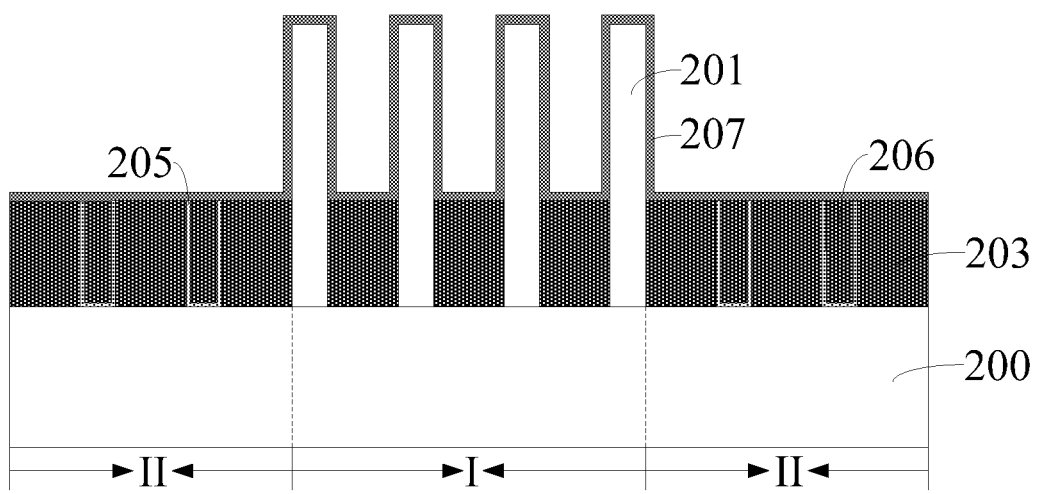
Figure 11:
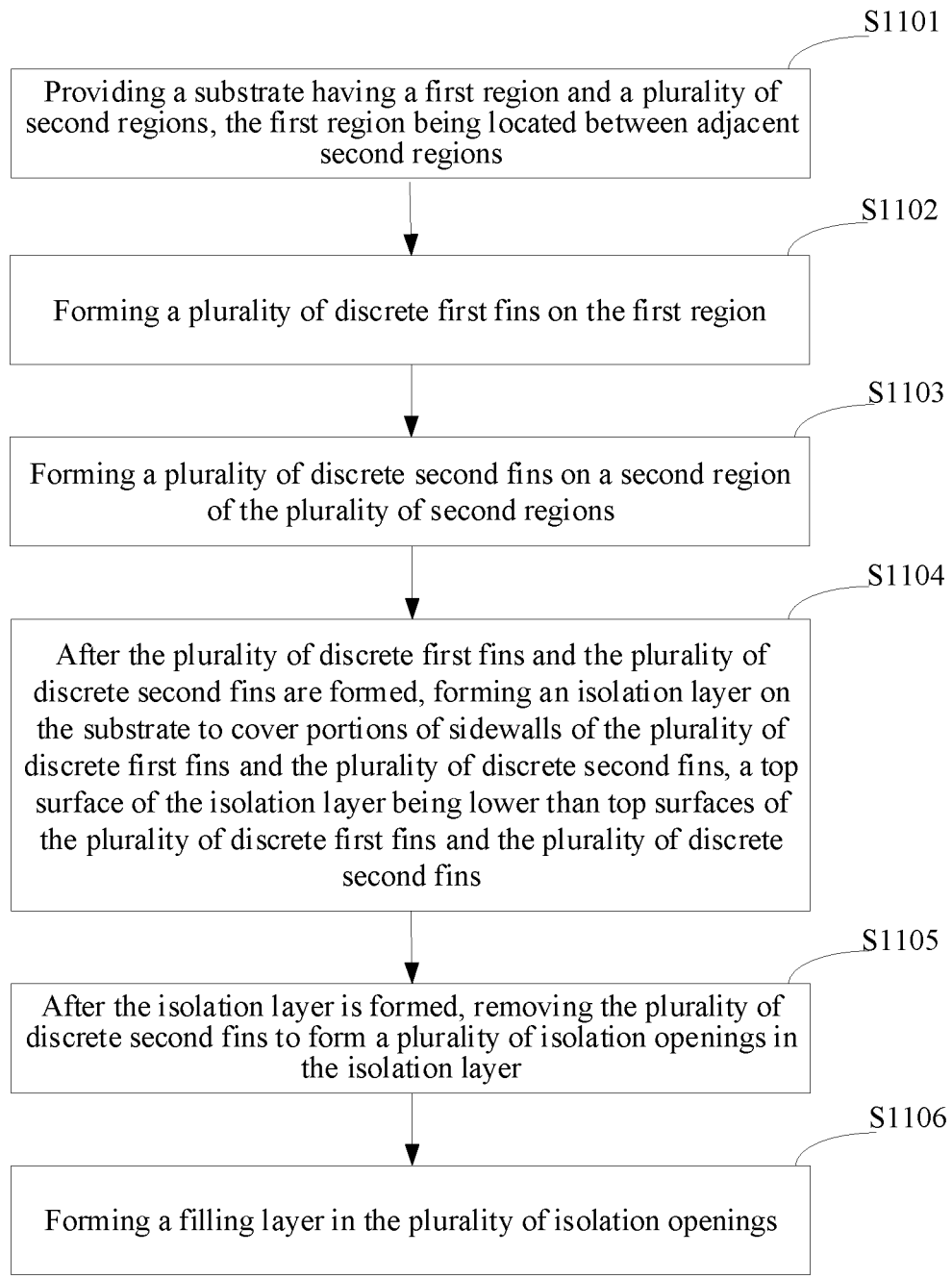
FIG. 11 is a flowchart of an exemplary method of forming the semiconductor structure according to some embodiments of the present disclosure.

Referring to FIG. 10, after the filling layer 206 is formed, a gate dielectric layer 207 is formed on the exposed sidewalls and top surfaces of the plurality of discrete first fins 201.

In some embodiments, the gate dielectric layer 207 is made of a high-K dielectric material. The high-K dielectric material includes: lanthanum oxide, cerium oxide, or hafnium oxide. In some embodiments, the gate dielectric layer 207 is made of hafnium oxide.

Correspondingly, the embodiments of the present disclosure also provide a semiconductor structure. Referring to FIG. 9 again, the semiconductor structure includes a substrate 200. The substrate 200 includes the first region I and a plurality of second regions II. The first region I is located between adjacent second regions II. The first region I includes a plurality of discrete first fins 201. The semiconductor structure further includes the isolation layer 203 formed on the substrate 200. The isolation layer 203 covers the portions of the sidewalls of the plurality of discrete first fins 201. The top surface of the isolation layer 203 is lower than the top surfaces of the plurality of discrete first fins 201. The semiconductor structure further includes the plurality of isolation openings (not shown) formed in the isolation layer 203 located in the plurality of second regions II. The semiconductor structure further includes the stop layer 205 located on bottom surfaces and sidewalls of the isolation openings. The semiconductor structure further includes the filling layer 206 located in the isolation openings. The filling layer 206 is located on the stop layer 205, and the top surface of the filling layer 206 and the top surface of the isolation layer 205 are evenly leveled.

The above description of the disclosed embodiments enables those skilled in the art to implement or use this application. Various modifications to these embodiments will be obvious to those skilled in the art, and the general principles defined herein can be implemented in other embodiments without departing from the spirit or scope of the present application. Therefore, this application will not be limited to the embodiments shown in the specification, but should conform to the broadest scope consistent with the principles and novelties disclosed in the specification.

What is claimed is:

1. A method of forming a semiconductor structure, comprising:
   providing a substrate having a first region and a plurality of second regions, the first region being located between adjacent second regions;
   forming a plurality of discrete first fins on the first region;
   forming a plurality of discrete second fins on a second region of the plurality of second regions;
   after the plurality of discrete first fins and the plurality of discrete second fins are formed, forming an isolation layer on the substrate to cover portions of sidewalls of the plurality of discrete first fins and the plurality of discrete second fins, a top surface of the isolation layer being lower than top surfaces of the plurality of discrete first fins and the plurality of discrete second fins;
   after the isolation layer is formed, removing the plurality of discrete second fins to form a plurality of isolation openings in the isolation layer;
   forming a stop layer on bottoms surfaces and sidewalls of the plurality of isolation openings; and
   forming a filling layer in the plurality of isolation openings, wherein the filling layer is located on the stop layer, and a top surface of the filling layer and a top surface of the isolation layer are evenly leveled.

2. The method of forming the semiconductor structure according to claim 1, wherein:
   the filling layer and the stop layer are made of different materials.

3. The method of forming the semiconductor structure according to claim 2, wherein:
   the filling layer is made of silicon oxide; and
   the stop layer is made of silicon nitride.

4. The method of forming the semiconductor structure according to claim 1, wherein forming the filling material layer includes:
   a fluid chemical vapor deposition process.

5. The method of forming the semiconductor structure according to claim 1, after the filling layer is formed, further comprising:
   forming a gate dielectric layer on the exposed sidewalls and top surfaces of the plurality of discrete first fins.

6. The method of forming the semiconductor structure according to claim 1, wherein:
an interval size between adjacent first fins is a first size, an interval size between adjacent second fins is a second size, and the first size is equal to the second size.

7. The method of forming the semiconductor structure according to claim 1, wherein forming the isolation layer includes:
forming an initial isolation layer on the substrate to cover the sidewalls of the plurality of discrete first fins and the plurality of discrete second fins; and
etching back the initial isolation layer to form the isolation layer to cover portions of the sidewalls of the plurality of discrete first fins and the plurality of discrete second fins, the top surface of the isolation layer being lower than the top surfaces of the plurality of discrete first fins and the plurality of discrete second fins.

8. The method of forming the semiconductor structure according to claim 7, wherein forming the initial isolation layer includes:
forming an initial isolation material layer on the substrate to cover the plurality of discrete first fins and the plurality of discrete second fins;
annealing the initial isolation material layer to form an isolation material layer; and
planarizing the isolation material layer until the top surfaces of the plurality of discrete first fins and the plurality of discrete second fins are exposed to form the initial isolation layer.

9. The method of forming the semiconductor structure according to claim 8, wherein forming the initial isolation material layer includes:
a fluid chemical vapor deposition process.

10. A semiconductor structure, comprising:
a substrate having a first region and a plurality of second regions, the first region being located between adjacent second regions;
a plurality of discrete first fins formed on the first region;
an isolation layer formed on the substrate to cover portions of sidewalls of the plurality of discrete first fins, a top surface of the isolation layer being lower than top surfaces of the plurality of discrete first fins and a plurality of discrete second fins;
a plurality of isolation openings formed in the isolation layer located in the plurality of discrete second regions;
a stop layer formed on bottoms surfaces and sidewalls of the plurality of isolation openings; and
a filling layer located in the plurality of isolation openings, wherein the filling layer is located on the stop layer, and a top surface of the filling layer and a top surface of the isolation layer are evenly leveled.

11. The semiconductor structure according to claim 10, wherein:
the substrate and the plurality of discrete first fins are made of silicon, germanium, silicon germanium, silicon carbide, gallium arsenide, or indium gallium.

12. The semiconductor structure according to claim 10, wherein:
the isolation layer is made of silicon oxide or silicon oxynitride.

13. The semiconductor structure according to claim 10, wherein:
the filling layer and the stop layer are made of different materials.

14. The semiconductor structure according to claim 13, wherein:
the filling layer is made of silicon oxide; and
the stop layer is made of silicon nitride.

15. The semiconductor structure according to claim 10, further comprising:
a gate dielectric layer formed on the isolation layer on the sidewalls and top surfaces of the plurality of discrete first fins.

16. The semiconductor structure according to claim 15, wherein:
the gate dielectric layer is made of a high-K dielectric material; and
the high-K dielectric material includes lanthanum oxide, cerium oxide, or hafnium oxide.

* * * * *